(12) United States Patent  
Xu et al.

(10) Patent No.: US 6,749,729 B1  
(45) Date of Patent: Jun. 15, 2004

(54) METHOD AND APPARATUS FOR WORKPIECE BIASSING UTILIZING NON-ARCING BIAS RAIL

(75) Inventors: Weilu Hang Xu, San Jose, CA (US); Sam Vi Luong, San Jose, CA (US); Yao-Tzung Roger Shih, Cupertino, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/270,638

(22) Filed: Oct. 16, 2002

Related U.S. Application Data

(60) Provisional application No. 60/363,976, filed on Mar. 13, 2002.

(51) Int. Cl.[7] .................. C23C 14/34; H01L 21/306; B05C 13/00; B23Q 1/64
(52) U.S. Cl. .................. 204/298.15; 204/298.23; 204/192.12; 156/345.54; 118/729; 118/500; 427/445; 269/56
(58) Field of Search .................. 204/192.12, 298.15, 204/298.23; 427/445; 269/56; 156/345.54; 118/729, 500

(56) References Cited

U.S. PATENT DOCUMENTS

| | | | | |
|---|---|---|---|---|
| 5,814,196 A | * | 9/1998 | Hollars et al. | 204/298.15 |
| 6,030,455 A | * | 2/2000 | Nozawa et al. | 118/500 |
| 6,035,805 A | * | 3/2000 | Rust | 118/723 VE |

* cited by examiner

Primary Examiner—Steven Versteeg
(74) Attorney, Agent, or Firm—McDermott, Will & Emery

(57) ABSTRACT

A non-arcing bias rail assembly for supplying an electrical bias potential to a moving workpiece/substrate holder, comprising an elongated metal strip adapted for mounting along a wall of a workpiece/substrate treatment apparatus and having a surface bounded by first and second opposed, laterally extending side edges; a bracket comprised of an electrically insulating material and including a first portion mounted on the surface adjacent to and extending along a portion of the first side edge, and a second portion forming an upstanding wall extending perpendicularly from the first portion and including a surface facing the second side edge of the metal strip; an electrically conductive bias contact spring assembly mounted on the upstanding wall of the bracket facing the second side edge; and electrically insulated wire means electrically connected to the bias contact spring assembly for supplying an electrical bias potential.

20 Claims, 3 Drawing Sheets

METHOD AND APPARATUS FOR WORKPIECE BIASSING UTILIZING NON-ARCING BIAS RAIL

CROSS-REFERENCE TO PROVISIONAL APPLICATION

This application claims priority from U.S. provisional patent application Serial No. 60/363,976 filed Mar. 13, 2002, the entire disclosure of which is incorporated herein by reference.

FIELD OF THE INVENTION

The present invention relates to an apparatus and method for applying an electrical bias potential to one or more workpieces/substrates carried by a moving pallet past at least one workpiece/substrate treating station, without incurring deleterious electrical arcing between the pallet and a bias rail utilized for applying the bias potential to the pallet. The invention has particular utility in the automated manufacture of magnetic or magneto-optical (MO) recording media comprising a multi-layer stack of thin film layers formed on a suitable substrate, e.g., a disk-shaped substrate, by means of a physical vapor deposition process, e.g., sputtering.

BACKGROUND OF THE INVENTION

Magnetic and MO media are widely employed in various applications, particularly in the computer industry for data/information storage and retrieval purposes. A magnetic medium in e.g., disk form, such as utilized in computer related applications, comprises a non-magnetic substrate, e.g., of glass, ceramic, glass-ceramic composite, polymer, metal, or metal alloy, typically an aluminum (Al)-based alloy such as aluminum-magnesium (Al-Mg), having at least one major surface on which a layer stack comprising a plurality of thin film layers constituting the medium are sequentially deposited. Such layers may include, in sequence from the workpiece (substrate) deposition surface, a plating layer, e.g., of amorphous nickel-phosphorus (Ni—P), a polycrystalline underlayer, typically of chromium (Cr) or a Cr-based alloy such as chromium-vanadium (Cr—V), a magnetic layer, e.g., of a cobalt (Co)-based alloy, and a protective overcoat layer, typically of a carbon-based material having good mechanical (i.e., tribological) properties. A similar situation exists with MO media, wherein a layer stack is formed which comprises a reflective layer, typically of a metal or metal alloy, one or more rare-earth thermo-magnetic (RE—TM) alloy layers, one or more dielectric layers, and a protective overcoat layer, for functioning as reflective, transparent, writing, writing assist, read-out, and protective layers.

According to conventional manufacturing methodology, a majority of the above-described layers constituting magnetic and/or MO recording media are deposited by cathode sputtering, typically by means of multi-cathode and/or multi-chamber sputtering apparatus wherein a separate cathode comprising a selected target material is provided for deposition of each component layer of the stack and the sputtering conditions are optimized for the particular component layer to be deposited. Each cathode comprising a selected target material can be positioned within a separate, independent process chamber, in a respective process chamber located within a larger chamber, or in one of a plurality of separate, interconnected process chambers each dedicated for deposition of a particular layer. According to such conventional manufacturing technology, a plurality of media substrates, typically in disk form, are serially transported by means of a multi-apertured pallet or similar type holder, in linear or circular fashion, depending upon the physical configuration of the particular apparatus utilized, from one sputtering target and/or process chamber to another for sputter deposition of a selected layer thereon.

Cost-effective productivity requirements imposed by automated manufacturing technology for magnetic and MO media require maximized sputter deposition rates, while at the same time, high quality, high areal recording density media require high purity thin film layers which exhibit respective physical, chemical, and/or mechanical properties, including, inter alia, proper crystal morphology necessary for obtaining high areal recording densities, e.g., polycrystallinity; good magnetic properties, e.g., coercivity and squareness ratio; chemical stability, e.g., inertness or corrosion resistance; and good tribological properties, e.g., wear resistance and low stiction/friction. Frequently, obtainment of such desirable physical, chemical, and/or mechanical properties for each of the constituent layers of the multi-layer media requires application of an electrical bias potential to the substrate during sputtering, e.g., a DC, AC, or RF bias potential, or some combination thereof, wherein the bias type and level of bias potential is optimized for each constituent layer For example, application of a suitable substrate bias during sputter deposition of metal-based underlayers and ferromagnetic metal alloy layers of thin film magnetic recording media can facilitate obtainment of preferred crystal orientations. In addition, application of a suitable bias during deposition of carbon (C)-based protective overcoat layers, e.g., diamond-like carbon (DLC) films, on thin film magnetic and MO recording media is extremely useful in increasing the density thereof to yield thinner films necessary for achieving ultra-high recording densities, while maintaining good tribological and corrosion resistance attributes of DLC films. For example, application of a negative electrical bias during DLC deposition in an argon (Ar)/hydrocarbon plasma causes positive ions, such as $Ar^+$ and $C_2H_0^+$ ions, to bombard the depositing DLC film, thereby compacting and densifying the film.

Referring to FIGS. 1–2, shown therein, in simplified, schematic cross-sectional top and side views, respectively, is an illustrative, but not limitative, embodiment of an in-line, pass-by apparatus for treating opposing surfaces of a plurality of vertically mounted workpieces/substrates (as disclosed in co-pending, commonly assigned U.S. application Ser. No. 10/212,693 filed Aug. 7, 2002), which apparatus can, if desired, form part of a larger, in-line apparatus for continuous, automated manufacture of, e.g., magnetic and/or magneto-optical (MO) recording media such as hard disks, and wherein a plurality of vertically oriented workpieces/substrates (e.g., disks) are transported in a linear path transversely past at least one treatment station for treatment of at least one surface of each of the plurality of workpieces/substrates.

More specifically, apparatus 10 comprises a series of linearly elongated vacuum chambers interconnected by a plurality of gate means G of conventional design, including a plurality of treatment chambers or stations, illustratively a pair of treatment chambers or stations 1 and 1', each including at least one, preferably a pair of spaced-apart, oppositely facing, linearly elongated treatment sources 2, 2', selected from among a variety of physical vapor deposition (PVD) sources, such as vacuum evaporation, sputtering, ion beam deposition (IBD), ion plating, plasma-enhanced chemical vapor deposition (PECVD), etc., sources, and/or from among a variety of plasma treatment sources, such as sputter/ion etching, hydrogen, nitrogen, oxygen, argon, etc., plasma sources for performing simultaneous treatment of both sides of dual-sided workpieces/substrates, and a pair of buffer/isolation chambers, such as 3, 3' and 3', 3", at opposite lateral ends of respective treatment chambers or stations 1 and 1' for insertion and withdrawal, respectively, of a plurality of vertically oriented workpieces/substrates, illustratively a plurality disk-shaped substrates 4 carried by a plurality of workpiece/substrate mounting/transport means, illustratively means 5, 5', which may, for example, be in the form of a perforated, flat planar pallet including conventional means (not shown in the drawing for illustrative simplicity) for releasable mounting/supporting the plurality of disk-shaped substrates 4 such that each of the opposing surfaces thereof faces a respective linearly elongated treatment source 2, 2' during "pass-by" transport through apparatus 10. Chambers 6, 6' respectively connected to the distal ends of inlet and outlet buffer/isolation chambers 3, 3" are provided for utilizing apparatus 10 as part of a larger, continuously operating, in-line apparatus wherein workpieces/substrates 4 receive processing/treatment antecedent and/or subsequent to processing in apparatus 10.

Apparatus 10 is, if required by the nature/mode of operation of treatment sources 2, 2', provided with conventional vacuum means (not shown in the drawing for illustrative simplicity) for maintaining the interior spaces of each of the constituent chambers 1, 1', 3, 3', 3", etc. at a reduced pressure below atmospheric pressure, e.g., from about $10^{-5}$ to about $10^{-9}$ Torr, and is further provided with a workpiece/substrate conveyor/transporter means of conventional design (not shown in the drawings for illustrative simplicity) for linearly transporting the workpiece/substrate mounting means 5, 5' through the respective gate means G from chamber-to-chamber in its travel through apparatus 10.

As indicated above, when utilized in the manufacture of disk-shaped magnetic and/or MO recording media, the workpieces/substrates 4, 4' carried by mounting means 5, 5' are in the form of annular discs, with inner and outer diameters corresponding to those of conventional hard disc-type magnetic and/or MO media, and each of the illustrated treatment chambers 1, 1' of apparatus 10 is provided with a pair of opposingly facing, linearly extending physical vapor deposition sources 2, typically elongated magnetron sputtering sources, for deposition of respective constituent thin films of the multi-layer magnetic or MO media on each surface of each of the plurality of disks 4, 4' carried by the perforated pallet-type mounting means 5, 5'.

The pallet-type mounting means 5, S' for mounting/transporting a plurality of disk-shaped workpieces/substrates 4, 4', respectively, may be generally similar to that shown and disclosed in U.S. Pat. No. 5,814,196 to Hollars, et al., the entire disclosure of which is incorporated herein. Adverting to FIG. 3, shown therein is a simplified, schematic side view of a pallet 5 adapted for mounting and transporting a plurality of vertically oriented, disk-shaped workpieces/substrates 4, e.g., for use in the in-line apparatus 10 of FIGS. 1–2 for depositing a plurality of thin film layers constituting a multi-layer thin film stack or laminate of a magnetic or MO recording medium. Pallet 5 typically comprises a sheet $5_S$ of an electrically conductive material, e.g., Al or an Al-alloy, machined to include a plurality of generally circularly-shaped apertures 7 extending therethrough, each aperture 7 including a semi-circularly extending groove formed in the lower half of the interior wall thereof for insertion and secure mounting of respective disk-shaped workpieces/substrates 4 therein, as is more fully described in the above-mentioned Hollars et al. U.S. Pat. No. 5,814,196. Pallet 5 further includes a pair of holes 8 extending through sheet $5_S$ at the top edge thereof for attachment to a linear transport mechanism (of conventional design not described herein for brevity) of apparatus 10 for moving pallet 5 through each of the serially arranged isolation and treatment (e.g., deposition) chambers, gates, air locks, etc., and a plurality of slots 9 extending through sheet $5_S$ at various locations about the periphery thereof for providing stress relief and thermal isolation during passage through apparatus 10, also as described more fully in U.S. Pat. No. 5,814,196. Contact bar 11 is provided at the lower edge of sheet $5_S$ for making sliding electrical contact with a conductive rail 12 (refer to FIGS. 1–2) located at the bottom of one or more of the treatment chambers/stations 1, 1', etc., for application of a suitable DC, AC, or RF bias potential (or any combination thereof) to sheet $5_S$, as by means of one or more bias potential sources electrically connected to one or more bias rail segments 12 (which one or more sources are not shown in FIGS. 1–2 for illustrative simplicity).

However, conventional bias rails, such as bias rail segments 12, are entirely metallic (hence electrically conductive) and of relatively large size, and as a consequence, during use, e.g., for depositing a DLC protective overcoat layer during the manufacture of magnetic or MO recording media, a dielectric coating comprised of DLC is formed thereon after exposure of the rail segment(s) 12 for an interval to a gas plasma utilized for the DLC deposition. Formation of the dielectric DLC coating layer on the bias rail segments disadvantageously results in arcing during the DLC deposition, which arcing is deleterious in that particles generated by the arcing cause glide rejects or voids in the DLC protective overcoat layers of the magnetic disks, thereby adversely affecting both product quality and yield. In extreme situations, arcing may necessitate shut-down of the production line in order to avoid loss of product quality and yield, which shutdown is extremely uneconomic in large scale manufacturing processing. For example, the cost (or value of product) of operating a typical large-scale apparatus for the automated manufacture of hard disks may be as high as about $ 25 K/hour; hence a shut-down time of about 30 min. due to arcing problems may incur an economic loss of as high as about $ 12.5 K.

Arcing typically occurs during switchover of the pallet from an unbiassed state to a biassed state, and may persist for about 30–40 min., or as long as is required for the energized bias rail surface to become free of the dielectric DLC coating layer. Arcing may still occur sporadically during subsequent operation because of the continued exposure of the bias rail segment(s) to the deposition plasma.

A further problem associated with the conventional bias rails arises from coupling of plasmas in adjacent deposition/treatment chambers. In such instances, the large area of the electrically conductive bias rail serves as the power electrode and the chamber walls serve as the ground electrode. The coupling plasma in the leading (i.e., upstream) chamber generates small particles (dust) which tend to settle on the clean surfaces of the disk workpieces/substrates prior to deposition of the first stratum of the DLC film. The presence or inclusion of such dust particles below or within the DLC film disadvantageously leads to glide rejects, voids in the DLC films, and poor film adhesion. Similarly, coupling plasma present in the trailing (i.e., downstream) chamber also results in contamination of the workpicce/substrate surface prior to deposition thereon.

In view of the foregoing, there exists a clear need for improved means and methodology for treating workpieces/ substrates carried by a moving workpiece/substrate holder past one or more treatment stations of an apparatus where an electrical bias potential is applied to the workpieces/substrates, which improved means and methodology do not incur the problems, disadvantages, and drawbacks associated with the use of conventionally configured bias rails for supplying the workpieces/substrates with the electrical bias potentials. More specifically, the present invention provides means and methodology for performing pass-by treatment of workpieces/substrates in a series of processing stations without incurring deleterious arcing between the workpiece/substrate carrier (e.g., pallet) and the bias rail, and/or without incurring plasma coupling between upstream and downstream processing chambers, and is of particular utility in the automated manufacture of thin film magnetic and/or magneto-optical (MO) recording media involving seriatim deposition of a plurality of thin film layers in plasma environments. Further, the inventive means and methodology afford full compatibility with all aspects of conventional automated manufacturing technology for such media and enjoy diverse utility in the manufacture of various devices and articles requiring the formation of high quality, defect-free thin films with optimal physical, chemical, and/or mechanical properties.

DISCLOSURE OF THE INVENTION

An advantage of the present invention is an improved non-arcing bias rail assembly for electrically contacting and supplying an electrical bias potential to a moving workpiece/substrate holder.

Another advantage of the present invention is an improved apparatus for performing a plurality of treatments of at least one surface of each of a plurality of workpieces/substrates.

Yet another advantage of the present invention is an improved apparatus for performing bias sputter deposition on a plurality of moving workpieces/substrates.

A further advantage of the present invention is an improved method of processing/treating at least one surface of each of a plurality of moving workpieces/substrates.

A still further advantage of the present invention is an improved method of performing bias sputter treatment of at least one surface of each of a plurality workpieces/substrates.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a non-arcing bias rail assembly for electrically contacting and supplying an electrical bias potential to a workpiece/substrate holder, comprising:

(a) a flat, elongated metal strip with a major surface bounded by first and second opposed, laterally extending side edges, the strip being adapted for mounting along a wall of a chamber of a workpiece/substrate treatment apparatus;

(b) a first bracket comprised of an electrically insulating material, the first bracket:

(i) including a first portion parallel to and mounted on the major surface of the metal strip adjacent the first side edge thereof;

(ii) extending along a portion of the first side edge; and (iii) including a second portion forming an upstanding wall extending perpendicularly from the first portion, the upstanding wall including a surface facing the second side edge of the metal strip;

(c) a first electrically conductive bias contact spring assembly, the first bias contact spring assembly mounted on the surface of the upstanding wall of the first bracket facing the second side edge of the metal strip; and (d) first electrically insulated wire means electrically connected to the first bias contact spring assembly for supplying the first bias contact spring assembly with an electrical bias potential.

According to embodiments of the present invention, the bias rail assembly further comprises:

(e) a second bracket comprised of an electrically insulating material, the second bracket:

(i) including a first portion parallel to and mounted on the major surface of the metal strip adjacent the second side edge thereof;

(ii) extending along a portion of the second side edge; and (iii) including a second portion forming an upstanding wall extending perpendicularly from the first portion, the upstanding wall including a surface facing the first side edge of the metal strip;

(f) a second electrically conductive bias contact spring assembly, the second bias contact spring assembly mounted on the surface of the upstanding wall of the second bracket facing the first side edge of the metal strip; and (g) second electrically insulated wire means electrically connected to the second bias contact spring assembly for supplying the second bias contact spring assembly with an electrical bias potential; wherein:

each of the first and second brackets comprises a ceramic material or ceramic-coated metal and each of the first and second electrically conductive bias contact spring assemblies is generally arcuately-shaped.

In accordance with further embodiments of the present invention, each of the first and second electrically conductive bias contact spring assemblies comprises an inner electrically conductive spring and an outer electrically conductive contact spring, whereas, according to other embodiments of the invention, each of the first and second electrically conductive bias contact spring assemblies comprises, in sequence, an electrically insulative inner spring, an electrically conductive bias contact spring including a centrally located protruding portion, and an electrically insulative outer spring including a centrally located opening for accommodating therein and exposing the centrally located protruding portion of the bias contact spring, wherein each of the electrically insulative inner and outer springs comprises a ceramic material or ceramic-coated metal.

According to still other embodiments of the present invention, each of the first and second electrically conductive bias contact spring assemblies comprises, in sequence, an electrically insulative inner spring, an electrically conductive bias contact spring, an electrically insulative outer spring including a centrally located opening, and an electrical contact means exposed and positioned within the centrally located opening of the electrically insulative outer spring bias contact spring and electrically connected to the electrically conductive bias contact spring, wherein each of the electrically insulative inner and outer springs comprises a ceramic material or ceramic-coated metal, and the electrical contact means comprises a pair of tabs extending through a pair of openings in the electrically conductive bias contact spring.

Embodiments according to the present invention include those which further comprise:

(h) at least one pair of guide means mounted to the elongated metal strip and adapted for guiding first and second oppositely facing surfaces of the moving workpiece/substrate holder into respective electrical contact with the first and second electrically conductive bias contact spring assemblies, wherein each of the guide means is electrically insulated for preventing arcing, e.g., each of the guide means comprises a ceramic cap.

According to additional embodiments of the present invention, the elongated metal strip includes at least one centrally located, laterally extending opening permitting movement of particulate material therethrough.

Another aspect of the present invention is an apparatus for performing a plurality of treatments of at least one surface of each of a plurality of moving workpieces/substrates, comprising:

(a) a plurality of linearly spaced-apart treatment stations for performing a corresponding plurality of treatments of at least one surface of each of the workpieces/substrates;

(b) a pallet adapted for mounting the plurality of workpieces/substrates and exposing the at least one surface of each of the workpieces/substrates for receipt of the plurality of treatments, the pallet including first and second contact strips on opposite sides thereof for making electrical contact with at least one bias potential source of the apparatus;

(c) means for transporting the pallet past the plurality of treatment stations;

wherein at least one of the plurality of treatment stations includes:

(d) means for applying an electrical bias potential to the plurality of workpieces/substrates, including a non-arcing bias rail assembly for making sliding electrical contact with the contact strip of the pallet, comprising:

(i) a flat, elongated metal strip mounted on an interior wall of the at least one treatment station, the strip having a major surface bounded by first and second opposed, laterally extending side edges;

(ii) a first bracket comprised of an electrically insulating material, the first bracket:
 (1) including a first portion parallel to and mounted on the major surface of the metal strip adjacent the first side edge thereof;
 (2) extending along a portion of the first side edge; and
 (3) including a second portion forming an upstanding wall extending perpendicularly from the first portion, the upstanding wall including a surface facing the second side edge of the metal strip;

(iii) a first electrically conductive bias contact spring assembly for electrically contacting the first contact strip of the pallet, the first bias contact spring assembly mounted on the surface of the upstanding wall of the first bracket facing the second side edge of the metal strip; and (iv) first electrically insulated wire means electrically connected to the first bias contact spring assembly for supplying the first bias contact spring assembly with an electrical bias potential.

According to embodiments of the present invention, the means for applying an electrical bias potential to the moving workpieces/substrates further comprises:

(v) a second bracket comprised of an electrically insulating material, the second bracket:
 (1) including a first portion parallel to and mounted on the major surface of the metal strip adjacent the second side edge thereof;
 (2) extending along a portion of the second side edge; and
 (3) including a second portion forming an upstanding wall extending perpendicularly from the first portion, the upstanding wall including a surface facing the first side edge of the metal strip;

(vi) a second electrically conductive bias contact spring assembly for electrically contacting the second contact strip of the pallet, the second bias contact spring assembly mounted on the surface of the upstanding wall of the second bracket facing the first side edge of the metal strip; and (vii) second electrically insulated wire means electrically connected to the second bias contact spring assembly for supplying the second bias contact spring assembly with an electrical bias potential.

Embodiments of the present invention include those wherein the plurality of treatment stations are selected from among physical vapor deposition (PVD) stations and plasma treatment stations. According to preferred embodiments of the present invention, the PVD stations are bias sputter deposition stations.

Yet another aspect of the present invention is a method of processing/treating at least one surface of each of a plurality of moving workpieces/substrates, comprising steps of:

(a) mounting a plurality of workpieces/substrates on a pallet such that at least one surface of each of the plurality of workpieces/substrates is exposed for processing/treatment, the pallet including first and second contact strips on opposite sides thereof;

(b) processing/treating the at least one surface of each of the plurality of workpieces/substrates at each of a plurality of processing/treating stations of an in-line processing/treating apparatus, the processing/treating comprising:

(i) transporting the pallet successively through each of the processing/treating stations; and (ii) applying a pre-selected electrical bias potential to at least one surface of each of the plurality of workpieces/substrates during processing/treatment thereof in at least one of said plurality of processing/treating stations by means of a non-arcing bias rail assembly making sliding electrical contact with a first contact strip on a first side of the pallet, comprising:

(1) a flat, elongated metal strip mounted on an interior wall of the at least one treatment station, the strip having a major surface bounded by first and second opposed, laterally extending side edges;

(2) a first bracket comprised of an electrically insulating material, the first bracket:
 including a first portion parallel to and mounted on the major surface of the metal strip adjacent the first side edge thereof;
 extending along a portion of the first side edge; and including a second portion forming an upstanding wall extending perpendicularly from the first portion, the upstanding wall including a surface facing the second side edge of the metal strip);

(3) a first electrically conductive bias contact spring assembly for electrically contacting the first contact strip of the pallet, the first bias contact spring assembly mounted on the surface of the upstanding wall of the first bracket facing the second side edge of the metal strip; and (4) first electrically insulated wire means electrically connected to the first bias contact spring assembly for supplying the first bias contact spring assembly with an electrical bias potential.

According to embodiments of the present invention, step (b) further comprises applying an electrical bias potential to both surfaces of each of the plurality of moving workpieces/substrates during processing/treatment thereof in at least one of the plurality of processing/treating stations by means of a non-arcing bias rail assembly making sliding electrical contact with a second contact strip on the second side of the pallet, comprising:

(1) a second bracket comprised of an electrically insulating material, the second bracket:
including a first portion parallel to and mounted on the major surface of the metal strip adjacent the second side edge thereof;
extending along a portion of the second side edge; and
including a second portion forming an upstanding wall extending perpendicularly from the first portion, the upstanding wall including a surface facing the first side edge of the metal strip;

(2) a second electrically conductive bias contact spring assembly for electrically contacting the second contact strip on the second side of the pallet, the second bias contact spring assembly mounted on the surface of the upstanding wall of the second bracket facing the first side edge of the metal strip; and (3) second electrically insulated wire means electrically connected to the second bias contact spring assembly for supplying the second bias contact spring assembly with an electrical bias potential.

According to preferred embodiments of the present invention, processing/treating step (b) comprises bias sputtering.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

Figure 1:
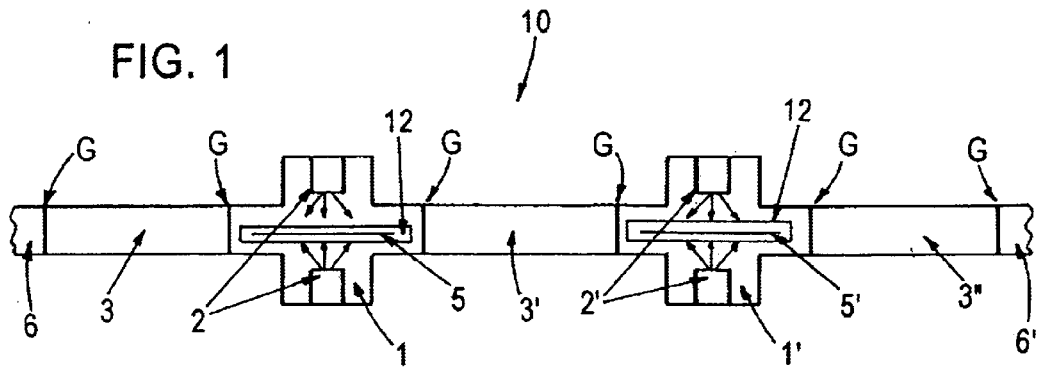
FIG. 1 is a simplified, schematic cross-sectional top view of an in-line, pass-by apparatus for treating opposing surfaces of a plurality of vertically oriented workpieces/substrates.

The present invention is based upon recognition by the inventors that the above-described drawbacks, disadvantages, etc., associated with conventional, arc-incurring means for applying an electrical bias potential to a plurality of moving workpieces/substrates carried by a moving pallet during "pass-by" treatment thereof in an apparatus comprising a plurality of serially arranged treatment stations for performing a plurality of treatments on at least one surface of each of the workpieces/substrates, can be overcome, or at least substantially eliminated, by use of an improved bias rail contact assembly for supplying the electrical bias potential to the moving pallet during "pass-by" treatment of the workpieces/substrates.

According to the invention, the components of the bias rail contact assembly are configured such that the surface area of the electrically energized member which actually makes contact with the contact bar of the moving pallet is minimized, and the contact is oriented such that the tendency for insulating layer deposition/formation to occur thereon is also minimized. According to the invention, at least one bracket utilized for mounting/supporting at least one contact assembly thereon is electrically insulating, by virtue of being either wholly composed of an insulating material or comprised of an electrically insulating layer overlying a metal material, whereby formation or deposition of an electrically insulating layer on electrically energized surfaces of the bias rail contact assembly leading to deleterious, undesirable electrical arcing between the moving pallet and the bias rail contact assembly, is effectively eliminated.

More specifically, according to the invention, the conventional elongated, electrically conductive bias rails utilized for making sliding electrical contact with the contact strip(s) at one end, typically the lower end, of the moving pallet, are not utilized for such purpose, but rather are utilized for mounting the at least one electrically insulating bracket which in turn mounts thereon the at least one bias contact assembly for making sliding electrical contact with bias contact strips on respective sides of the pallet at the lower end thereof. The electrically insulating bracket is mounted on the bias rail so as to extend along a portion of a side edge of the major surface of the bias rail, and comprises an upstanding wall extending perpendicularly to the major surface. A generally arcuately-shaped bias contact spring is mounted on the surface of the upstanding wall facing the other side edge of the bias rail for making sliding electrical contact with a contact strip along a first side of the pallet at a lower end thereof. According to preferred embodiments of the invention, a second, similarly constituted electrically insulating bracket with a generally arcuately-shaped bias contact spring is provided so as to extend along a portion of the other side edge rail for making sliding electrical contact with a contact strip along a second side of the pallet at the lower end thereof. Each bias contact spring is provided with an appropriate electrical bias potential by means of an electrically insulated wire or similar means.

According to preferred embodiments of the invention, each of the generally arcuately-shaped bias contact springs comprises an assembly of electrically conducting and electrically insulating components for minimizing, i.e., limiting, the exposed area of the electrically conducting portion to that portion which actually makes contact with the contact strip of the pallet, thereby further reducing the likelihood of deposition/formation of insulating material thereon leading to deleterious arcing.

Figure 2:
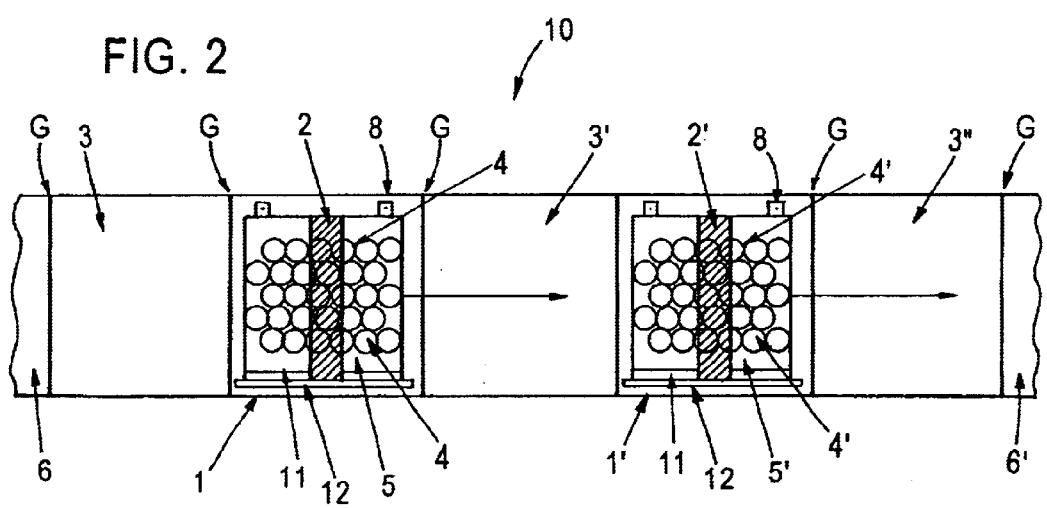
FIG. 2 is a simplified, schematic cross-sectional side view of the in-line apparatus shown in FIG. 1.
Figure 4:
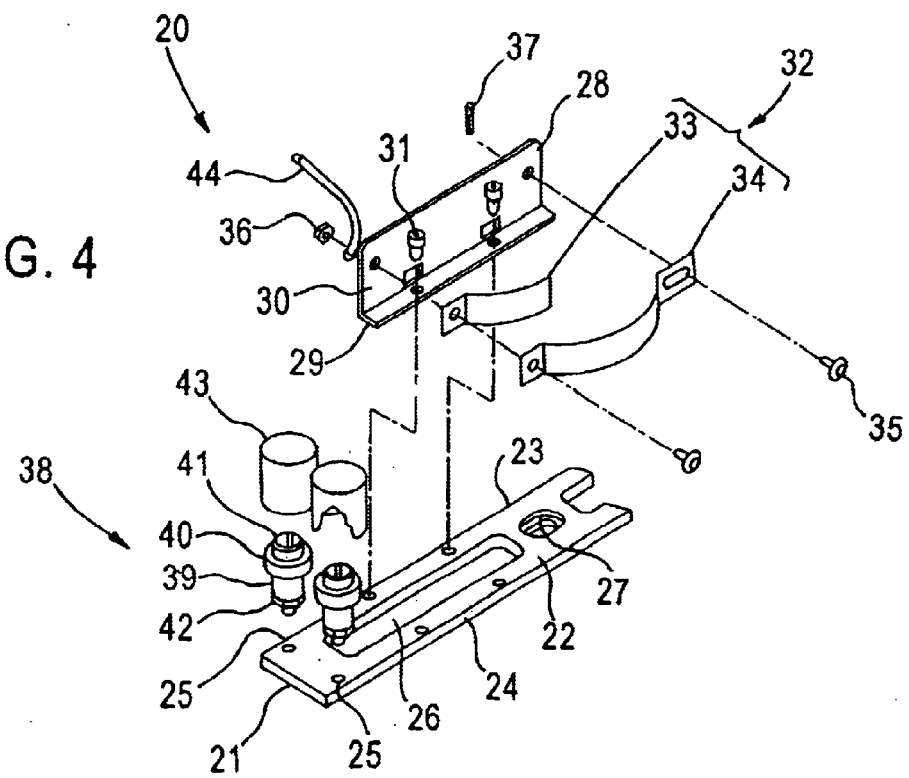
FIG. 4 is a schematic, exploded perspective view of a non-arcing bias rail contact assembly 20 according to an embodiment of the invention.

Referring now to FIG. 4, schematically shown therein, in exploded perspective view, is a non-arcing bias rail contact assembly 20 according to an embodiment of the invention. As illustrated, non-arcing bias rail contact assembly 20 comprises an elongated bias rail strip 21 (only a portion of the length thereof shown in FIG. 4 for illustrative simplicity) with major (upper) surface 22 bounded by opposing first 23 and second 24 side edges, with a plurality of spaced-apart openings 25 for mounting various components (described below in more detail) thereon located adjacent each side edge 23, 24. Bias rail strip 21 may be made of metal, if desired, and typically may further include a plurality of centrally located, larger openings 26, 27 for passage of dust particles, deposits, debris, etc., therethrough, and for facilitating mounting of strip 21 to a bottom wall of a treatment chamber (as with bias rail strip 12 in FIGS. 1–2).

According to the invention, an L-shaped flange or bracket 28, either wholly formed of an electrically insulating material, e.g., a ceramic material, or comprised of metal coated with a layer of an electrically insulating material, e.g., a ceramic material, and including a generally horizontally extending, narrower portion 29 and a generally vertically extending, wider (wall) portion 30 is mounted, via fasteners 31 extending through openings 25, so as to extend along a portion of the first side edge 23 of the upper surface 22 of bias rail 21. A generally arcuately-shaped contact spring assembly 32, comprised of a shorter, inner contact spring 33 and a longer, outer contact spring 34 is mounted on the vertically extending wall portion 30 of flange or bracket 28 facing the second side edge 24 of bias rail 21, via suitable fasteners 35 extending through respective openings formed in the inner and outer contact springs 33, 34 and mating with, e.g., nut 36 or cotter pin 37.

Bias rail contact assembly 20 may further comprise a plurality of pair of pallet guide assemblies 38 mounted to bias rail 21 at spaced apart locations, one pair of which is shown in FIG. 4 as located at an end of bias rail. The pairs of pallet guide assemblies 38 serve to guide/properly position pallets during their passage through the treatment chamber(s). As illustrated, each pallet guide assembly 38 is mounted to the upper surface 22 of bias rail 21 via a respective opening 25 and comprises a vertically oriented spacer member 39 supporting a rotatable bearing 40, the latter maintained in place by fastener 41 and associated nut 42. Ceramic cap 43 extends over the spacer member, rotatable bearing, and fastener/nut of pallet guide assembly 38 and is rotatable along with bearing 40. Ceramic cap 43 is provided in order to prevent hissing arcing between the pallet guides 38 and the electrically energized pallet. Provision of the elongated slot(s) 26 in the bias rail 21 prevents arcing from occurring between the bottom edge of the energized pallet and particulate matter accruing on the upper surface 22 of the bias rail 21.

According to the invention, a suitable electrical bias potential is applied to contact spring assembly 32 via an electrically insulated, e.g., ceramic-covered, wire 44 electrically connected to a suitable bias potential source (not shown in the drawing for illustrative simplicity).

By way of illustration, the shorter, inner, arcuately-shaped contact spring 33 may be made of 4 mil thick stainless steel to provide sufficient stiffness so as to prevent deformation of the longer, outer, arcuately-shaped contact spring 34, which may be made of 4 mil thick copper.

Figure 5:
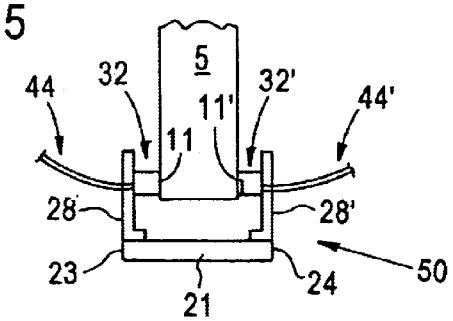
FIG. 5 is a simplified, schematic cross-sectional end view of a non-arcing bias rail assembly 50 according to another embodiment of the invention.
Figure 3:
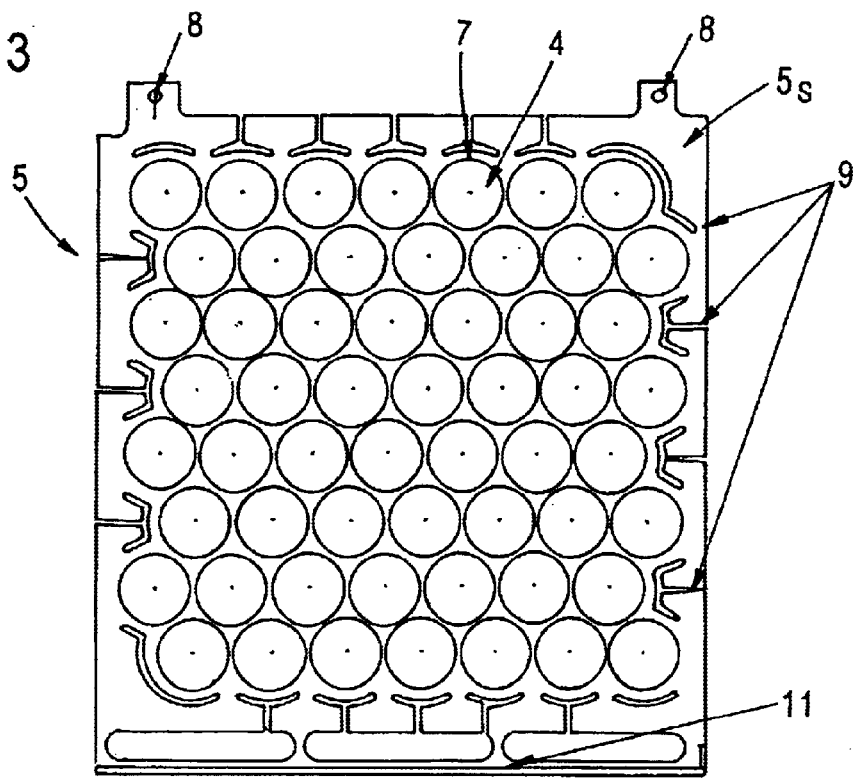
FIG. 3 is a simplified, schematic side view of a pallet for mounting and transporting a plurality of vertically oriented, disk-shaped workpieces/substrates through the in-line apparatus of FIGS. 1–2.

Adverting to FIG. 5, shown therein is a simplified, schematic cross-sectional end view of a non-arcing bias rail assembly 50 according to a preferred embodiment of the invention, for simultaneously applying an electrical bias potential to both surfaces of workpieces/substrates carried on a pallet 5, wherein the non-arcing bias rail contact assembly 20 of FIG. 4 is modified to include a second, identically configured bias spring contact assembly 32' mounted on a second, identically configured insulative flange or bracket 28' affixed to the second edge 24 of bias rail 21 and supplied with a bias potential via insulated wire 44' (electrically connected to a suitable bias potential source not shown in the figure for illustrative simplicity). Sliding electrical contact is made between the first and second bias spring contact assemblies 32, 32' and the respective contact strips 11, 11' located along the opposing surfaces of pallet 5 adjacent the lower end thereof.

Figure 6:
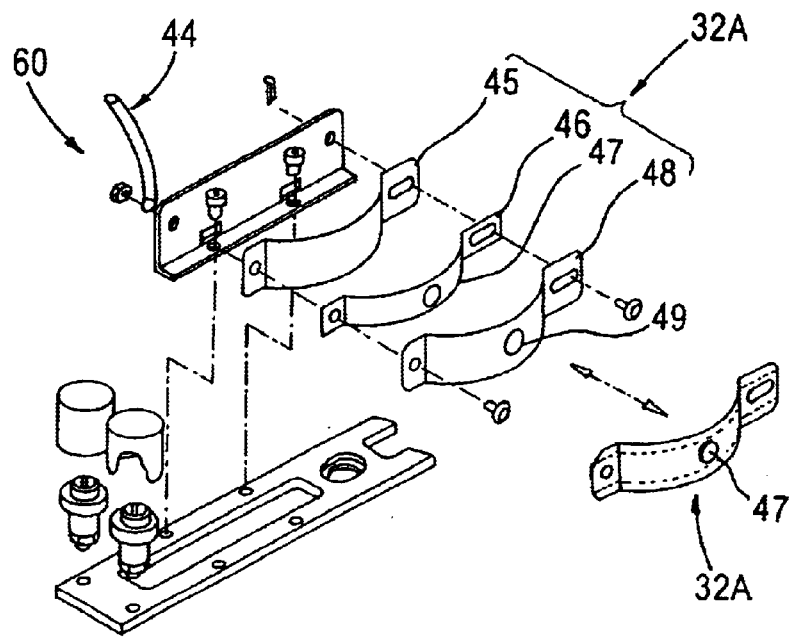
FIGS. 6–7 are schematic, exploded perspective views of non-arcing bias rail assemblies 60 and 70 according to further embodiments of the invention.
Figure 7:
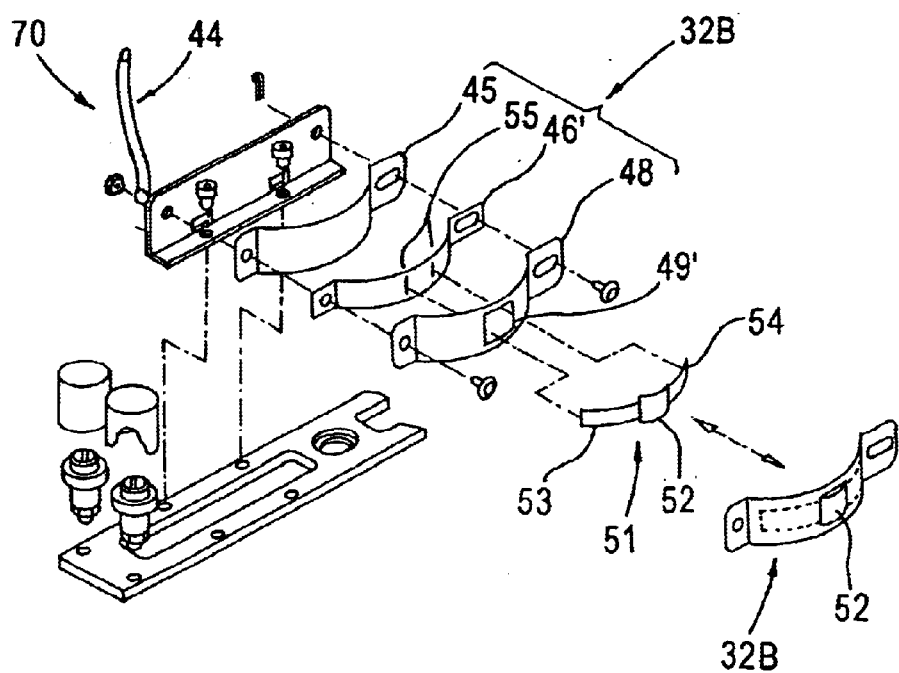

Referring to FIGS. 6–7, shown therein are schematic, exploded perspective views of non-arcing bias rail assemblies 60 and 70 according to further embodiments of the invention, which bias rail assemblies are similar in essential respect to the embodiment shown in FIG. 4, modified to be especially well-suited for use in applications where the contact spring assembly is situated in a zone of heavy deposition of a dielectric coating. According to embodiment 60 shown in FIG. 6, generally arcuately-shaped bias contact spring assembly 32A comprises a stacked or sandwiched plurality of generally arcuately-shaped members, including, in sequence, an electrically insulating inner spring 45 (either made entirely of an insulative material, e.g.,ceramic, or of ceramic-coated metal), an electrically conductive bias contact spring 46 including a centrally located, generally circularly-shaped, protruding ("nipple") portion 47, and an electrically insulating outer spring 48 (either made entirely of an insulative material, e.g., ceramic, or of ceramic-coated metal) provided with a centrally located, generally circularly-shaped opening 49 extending therethrough for accommodating therein and exposing the centrally located, generally circularly-shaped, protruding "nipple" portion 47 of the electrically conductive bias contact spring 46.

According to this embodiment, the exposed area of the bias contact spring assembly 32A is limited to the protruding "nipple" area 47, which area is well shielded from deposition thereon by virtue of contact with the contact strip of the pallet. As before, a second, substantially identical bias spring contact assembly 32A is typically and preferably provided for applying an electrical bias potential to a contact strip on the other side of the pallet.

According to embodiment 70 shown in FIG. 7, generally arcuately-shaped bias contact spring assembly 32B comprises a stacked or sandwiched plurality of generally arcuately-shaped members, including, in sequence, an electrically insulating inner spring 45 (either made entirely of an insulative material, e.g., ceramic, or of ceramic-coated metal), an electrically conductive bias contact spring 46' including a parallel pair of vertically extending, centrally located slits 55 an electrically insulating outer spring 48 (either made entirely of an insulative material, e.g., ceramic, or of ceramic-coated metal) provided with a centrally located, generally square-shaped opening 49', an electrically conductive, resilient spring-like member 51 having a generally arcuately-shaped, square central section 52 and a pair of tabs 53, 54 extending therefrom in opposite directions, which tabs 53, 54 are inserted through the generally square-shaped central opening 49 of the electrically insulating outer spring 48 and into the parallel pair of vertically extending, centrally located slits 55 in the electrically conductive bias contact spring 46'. The radius of curvature of the generally arcuately-shaped, square central section 52 of member 51 is smaller than the radius of curvature of the other springs 45, 46', and 48 of contact spring assembly 32B.

In-line, multi-chamber, pass-by type treatment apparatus equipped with bias rail assemblies according to the invention for application of electrical bias potentials to moving pallets carrying a plurality of workpieces/substrates, e.g., annular disk-shaped workpieces/substrates in the automated manufacture of magnetic and/or MO recording media, have exhibited no deleterious arcing even when continuously operated over a period of several months, clearly demonstrating the efficacy of the invention.

The inventive apparatus and method enjoys particular utility in the manufacture of multi-layer, thin-film magnetic and/or MO recording media, wherein the manufacturing process involves deposition and/or treatment steps requiring application of an electrical bias to the media workpiece/substrate for obtaining desired film or media properties. The inventive apparatus advantageously eliminates the disadvantageous occurrence of arcing when sputter depositing multi-layer magnetic and/or MO structures at optimal substrate bias potential for each layer. In addition, the inventive methodology enjoys full compatibility with all other aspects of automated magnetic and MO media manufacture and the inventive concept is broadly applicable to the manufacture of a variety of different products utilizing an in-line deposition apparatus without incurring deletrious arcing, e.g., coated architectural glass and optical coatings comprising a stacked plurality of dielectric layers.

In the previous description, numerous specific details are set forth, such as specific materials, structures, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A non-arcing bias rail assembly for electrically contacting and supplying an electrical bias potential to a moving workpiece/substrate holder, comprising:

(a) a flat, elongated metal strip with a major surface bounded by first and second opposed, laterally extending side edges, said strip adapted for mounting along a wall of a chamber of a workpiece/substrate treatment apparatus;

(b) a first bracket comprised of an electrically insulating material, said first bracket:
        (i) including a first portion parallel to and mounted on said major surface of said metal strip adjacent said first side edge thereof;
        (ii) extending along a portion of said first side edge; and
        (iii) including a second portion forming an upstanding wall extending perpendicularly from said first portion, said upstanding wall including a surface facing said second side edge of said metal strip;

(c) a first electrically conductive bias contact spring assembly, said first bias contact spring assembly mounted on said surface of said upstanding wall of said first bracket facing said second side edge of said metal strip; and (d) first electrically insulated wire means electrically connected to said first bias contact spring assembly for supplying said first bias contact spring assembly with an electrical bias potential.

2. The bias rail assembly as in claim 1, further comprising:

(e) a second bracket comprised of an electrically insulating material, said second bracket:
        (i) including a first portion parallel to and mounted on said major surface of said metal strip adjacent said second side edge thereof;
        (ii) extending along a portion of said second side edge; and
        (iii) including a second portion forming an upstanding wall extending perpendicularly from said first portion, said upstanding wall including a surface facing said first side edge of said metal strip;

(f) a second electrically conductive bias contact spring assembly, said second bias contact spring assembly mounted on said surface of said upstanding wall of said second bracket facing said first side edge of said metal strip; and (g) second electrically insulated wire means electrically connected to said second bias contact spring assembly for supplying said second bias contact spring assembly with an electrical bias potential.

3. The bias rail assembly as in claim 2, wherein:
   each of said first and second brackets comprises a ceramic material or ceramic-coated metal.

4. The bias rail assembly as in claim 2, wherein: each of said first and second electrically conductive bias contact spring assemblies is generally arcuately-shaped.

5. The bias rail assembly as in claim 4, wherein:
   each of said first and second electrically conductive bias contact spring assemblies comprises an inner electrically conductive spring and an outer electrically conductive contact spring.

6. The bias rail assembly as in claim 4, wherein:
   each of said first and second electrically conductive bias contact spring assemblies comprises, in sequence, an electrically insulative inner spring, an electrically conductive bias contact spring including a centrally located protruding portion, and an electrically insulative outer spring including a centrally located opening for accommodating therein and exposing said centrally located protruding portion of said bias contact spring.

7. The bias rail assembly as in claim 6, wherein:
   each of said electrically insulative inner and outer springs comprises a ceramic material or ceramic-coated metal.

8. The bias rail assembly as in claim 4, wherein:

each of said first and second electrically conductive bias contact spring assemblies comprises, in sequence, an electrically insulative inner spring, an electrically conductive bias contact spring, an electrically insulative outer spring including a centrally located opening, and an electrical contact means exposed and positioned within said centrally located opening of said electrically insulative outer spring bias contact spring and electrically connected to said electrically conductive bias contact spring.

9. The bias rail assembly as in claim 8, wherein:

each of said electrically insulative inner and outer springs comprises a ceramic material or ceramic-coated metal, and said electrical contact means comprises a pair of tabs extending through a pair of openings in said electrically conductive bias contact spring.

10. The bias rail assembly as in claim 2, further comprising:

(h) at least one spaced-apart pair of guide means mounted to said elongated metal strip and adapted for guiding first and second oppositely facing surfaces of said moving workpiece/substrate holder into respective electrical contact with said first and second electrically conductive bias contact spring assemblies.

11. The bias rail assembly as in claim 10, wherein:

each of said guide means is electrically insulated for preventing arcing.

12. The bias rail assembly as in claim 11, wherein:

each of said guide means comprises a ceramic cap.

13. The bias rail assembly as in claim 1, wherein:

said elongated metal strip includes at least one centrally located, laterally extending opening permitting movement of particulate material therethrough.

14. An apparatus for performing a plurality of treatments of at least one surface of each of a plurality of moving workpieces/substrates, comprising:

(a) a plurality of linearly spaced-apart treatment stations for performing a corresponding plurality of treatments of said at least one surface of each of said workpieces/substrates;

(b) a pallet adapted for mounting said plurality of workpieces/substrates and exposing said at least one surface of each of said workpieces/substrates for receipt of said plurality of treatments, said pallet including first and second contact strips on opposite sides thereof for making electrical contact with at least one bias potential source of said apparatus;

(c) means for transporting said pallet past said plurality of treatment stations; wherein at least one of said plurality of treatment stations includes:

(d) means for applying an electrical bias potential to said plurality of moving workpieces/substrates, including a non-arcing bias rail assembly for making sliding electrical contact with said contact strip of said pallet, comprising:

(i) a flat, elongated metal strip mounted on an interior wall of said at least one treatment station, said strip having a major surface bounded by first and second opposed, laterally extending side edges;

(ii) a first bracket comprised of an electrically insulating material, said first bracket:

(1) including a first portion parallel to and mounted on said major surface of said metal strip adjacent said first side edge thereof;

(2) extending along a portion of said first side edge; and (3) including a second portion forming an upstanding wall extending perpendicularly from said first portion, said upstanding wall including a surface facing said second side edge of said metal strip;

(iii) a first electrically conductive bias contact spring assembly for electrically contacting said first contact strip of said pallet, said first bias contact spring assembly mounted on said surface of said upstanding wall of said first bracket facing said second side edge of said metal strip; and (iv) first electrically insulated wire means electrically connected to said first bias contact spring assembly for supplying said first bias contact spring assembly with an electrical bias potential.

15. The apparatus as in claim 14, wherein said means for applying an electrical bias potential to said moving workpieces/substrates further comprises:

(v) a second bracket comprised of an electrically insulating material, said second bracket:

(1) including a first portion parallel to and mounted on said major surface of said metal strip adjacent said second side edge thereof;

(2) extending along a portion of said second side edge; and (3) including a second portion forming an upstanding wall extending perpendicularly from said first portion, said upstanding wall including a surface facing said first side edge of said metal strip;

(vi) a second electrically conductive bias contact spring assembly for electrically contacting said second contact strip of said pallet, said second bias contact spring assembly mounted on said surface of said upstanding wall of said second bracket facing said first side edge of said metal strip; and (vii) second electrically insulated wire means electrically connected to said second bias contact spring assembly for supplying said second bias contact spring assembly with an electrical bias potential.

16. The apparatus as in claim 14, wherein:

said plurality of treatment stations are selected from among physical vapor deposition (PVD) stations and plasma treatment stations.

17. The apparatus as in claim 16, wherein:

said PVD stations are bias sputter deposition stations.

18. A method of processing/treating at least one surface of each of a plurality of moving workpieces/substrates, comprising steps of:

(a) mounting a plurality of workpieces/substrates on a pallet such that at least one surface of each of said plurality of workpieces/substrates is exposed for processing/treatment, said pallet including first and second contact strips on opposite sides thereof;

(b) processing/treating said at least one surface of each of said plurality of workpieces/substrates at each of a plurality of processing/treating stations of an in-line processing/treating apparatus, said processing/treating comprising:

(i) transporting said pallet successively through each of said processing/treating stations; and (ii) applying a pre-selected electrical bias potential to at least one surface of each of said plurality of workpieces/substrates during processing/treatment thereof in at least one of said plurality of processing/treating stations by means of a non-arcing bias rail assembly making sliding electrical contact with a first contact strip on a first side of said pallet, comprising:
  (1) a flat, elongated metal strip mounted on an interior wall of said at least one treatment station, said strip having a major surface bounded by first and second opposed, laterally extending side edges;
  (2) a first bracket comprised of an electrically insulating material, said first bracket:
    including a first portion parallel to and mounted on said major surface of said metal strip adjacent said first side edge thereof;
    extending along a portion of said first side edge; and
    including a second portion forming an upstanding wall extending perpendicularly from said first portion, said upstanding wall including a surface facing said second side edge of said metal strip;
  (3) a first electrically conductive bias contact spring assembly electrically contacting said first contact strip of said pallet, said first bias contact spring assembly mounted on said surface of said upstanding wall of said first bracket facing said second side edge of said metal strip; and
  (4) first electrically insulated wire means electrically connected to said first bias contact spring assembly for supplying said first bias contact spring assembly with an electrical bias potential.

19. The method according to claim 18, wherein step (b) further comprises applying an electrical bias potential to both surfaces of each of said plurality of moving workpieces/substrates during processing/treatment thereof in at least one of said plurality of processing/treating stations by means of a non-arcing bias rail assembly making sliding electrical contact with a second contact strip on a second side of said pallet, comprising:
  (1) a second bracket comprised of an electrically insulating material, said second bracket:
    including a first portion parallel to and mounted on said major surface of said metal strip adjacent said second side edge thereof;
    extending along a portion of said second side edge; and
    including a second portion forming an upstanding wall extending perpendicularly from said first portion, said upstanding wall including a surface facing said first side edge of said metal strip;
  (2) a second electrically conductive bias contact spring assembly for electrically contacting said second contact strip on said second side of said pallet, said second bias contact spring assembly mounted on said surface of said upstanding wall of said second bracket facing said first side edge of said metal strip; and
  (3) second electrically insulated wire means electrically connected to said second bias contact spring assembly for supplying said second bias contact spring assembly with an electrical bias potential.

20. The method according to claim 18, wherein: processing/treating (b) comprises bias sputtering.

* * * * *